United States Patent
Lowrey

(10) Patent No.: US 6,687,153 B2
(45) Date of Patent: Feb. 3, 2004

(54) PROGRAMMING A PHASE-CHANGE MATERIAL MEMORY

(75) Inventor: Tyler A. Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/404,171

(22) Filed: Apr. 1, 2003

(65) Prior Publication Data

US 2003/0218904 A1 Nov. 27, 2003

Related U.S. Application Data

(62) Division of application No. 09/895,135, filed on Jun. 29, 2001, now Pat. No. 6,570,784.

(51) Int. Cl.$^7$ ................................................ G11C 11/00
(52) U.S. Cl. ........................ 365/163; 365/113; 365/148
(58) Field of Search ................................ 365/163, 113, 365/148

(56) References Cited

U.S. PATENT DOCUMENTS 6,339,544 B1 * 1/2002 Chiang et al. .............. 365/163
6,487,113 B1 * 11/2002 Park et al. .................. 365/163
6,625,054 B2 * 9/2003 Lowrey et al. ............. 365/148

FOREIGN PATENT DOCUMENTS

GB    1 372 414    10/1974

* cited by examiner

Primary Examiner—Van Thu Nguyen
Assistant Examiner—Toan Le
(74) Attorney, Agent, or Firm—Trop, Pruner & Hu, P.C.

(57) ABSTRACT

The memory device has constituent cells which include a structural phase-change material to store the cells data. This material may be, for instance, a chalcogenide alloy. A first pulse is applied to the cell to leave the material in a first state, such as a reset state in which the material is relatively amorphous and has relatively high resistivity. Thereafter, a second pulse is applied to the cell to change the material from the first state to a second, different state, such as a set state in which the material is relatively crystalline and has relatively low resistivity. This second pulse has a generally triangular shape, rather than a rectangular one.

22 Claims, 7 Drawing Sheets

PROGRAMMING A PHASE-CHANGE MATERIAL MEMORY

This is a divisional of prior application Ser. No. 09/895,135, filed Jun. 29, 2001, now U.S. Pat. No. 6,570,784.

BACKGROUND

This invention is related to techniques for programming a structural phase-change material solid state memory device such as those that use a chalcogenide material which can be programmed into different resistivity states to store data.

Solid state memory devices that use a structural phase-change material as the data storage mechanism (referred to here simply as 'phase-change memories') offer significant advantages in both cost and performance over conventional charge storage based memories. The phase-change memory is made of an array of constituent cells where each cell has some structural phase-change material to store the cell's data. This material may be, for instance, a chalcogenide alloy that exhibits a reversible structural phase change from amorphous to crystalline. A small volume of the chalcogenide alloy is integrated into a circuit that allows the cell to act as a fast switching programmable resistor. This programmable resistor can exhibit greater than 40 times dynamic range of resistivity between the crystalline state (low resistivity) and the amorphous state (high resistivity), and is also capable of exhibiting multiple, intermediate states that allow multi-bit storage in each cell. The data stored in the cell is read by measuring the cell's resistance. The chalcogenide alloy cell is also non-volatile.

A conventional technique for programming a phase-change memory cell is to apply a rectangular pulse of current (having a constant magnitude) to the cell, at a voltage greater than a switching threshold for the phase-change material, which leaves the material in the reset state (amorphous and high resistivity). This may be followed by the application of a subsequent rectangular pulse, also at a voltage greater than the switching threshold, which changes the material to a set state (crystalline and low resistivity). The reset pulse has a higher magnitude of current than the set pulse so that the temperature of the phase change material is raised to $T_m$, the amorphizing temperature, before the material is rapidly cooled down and is left in the amorphous state to change into the crystalline state, the material can be heated back up to an optimum temperature $T_{opt}$, which is lower than $T_m$. The temperature $T_{opt}$ is that which allows the material in the cell to be crystallized in a relatively short time interval and yielding a relatively low resistance. Ideally, this could be accomplished by having the magnitude of the set pulse be smaller than that of the reset pulse to prevent the phase-change material from reaching the amorphizing temperature, but large enough to cause the material to reach $T_{opt}$.

Because of fabrication process and material variations in phase change memories, the actual temperature of the phase-change material in the cells of a manufactured device varies significantly from cell to cell, for a given programming current/voltage level obtained by a set pulse. This variation can cause the material in one or more cells of a device to inadvertently reach $T_m$ during application of the conventional rectangular set pulse, and thereby cause those cells to erroneously remain in the reset state rather than change to the set state. To avoid this problem, conventional programming techniques use a rectangular set pulse (applied to every cell in the device) that has a reduced magnitude, as shown in FIG. 1. The magnitude of the set current is sufficiently low, in view of the expected variation in cell temperature at that magnitude, to guarantee that no cell in the device reaches Tm while the set pulse is applied to it. This solution, however, may slow down the programming of the memory device, since a longer rectangular set pulse is needed due to the less than optimal temperatures being generated by the lower magnitude of the set pulse. In addition, many cells in the memory are subjected to significantly less than the optimum crystallization temperature which reduces the dynamic range in resistivity between the set and reset states in those cells.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, the set pulse for programming a phase-change memory is shaped to be generally triangular, rather than rectangular. Such a pulse is also referred to here as a 'set sweep'. With the set sweep, magnitude of the set pulse current can be increased, so that the phase-change material in all cells of a device can reach temperatures of at least $T_{opt}$ during the set pulse yet still change to the set state, due to the downward slope in the trailing portion of the pulse. Better crystallization takes place in the memory, despite fabrication process and material variations. With better crystallization, the resistivity differences between the set and reset states are more pronounced. This means that the tolerance for variations in the memory has increased, therefore lowering manufacturing costs by allowing greater yields from the fabrication and testing flows.

Although the memory device may reach temperatures as high as $T_m$ when the magnitude of the triangular set pulse is greater than the conventional set current magnitude, the triangular shaped pulse has a decaying or downward sloping trailing portion such that even those cells that reach $T_m$ will have a chance to cool down to and crystallize at or near $T_{opt}$. The decay during the trailing portion is slow enough to ensure that those cells spend the minimum required time interval at approximately $T_{opt}$, to yield better crystallization even in those cells. For devices that are expected to have large variations across their cell populations, the time of the current transition from its maximum value to its minimum value for the slope of the trailing portion may need to be longer than for devices that are expected to show relatively small variations.

Figure 1:
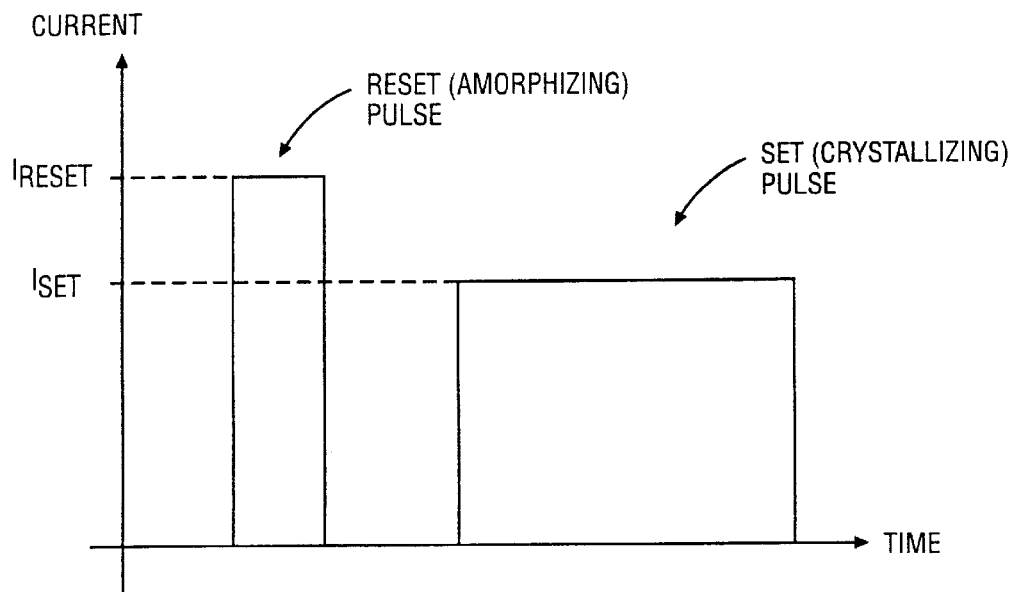
FIG. 1 shows a conventional sequence of pulses for programming a phase-change memory.
Figure 2:
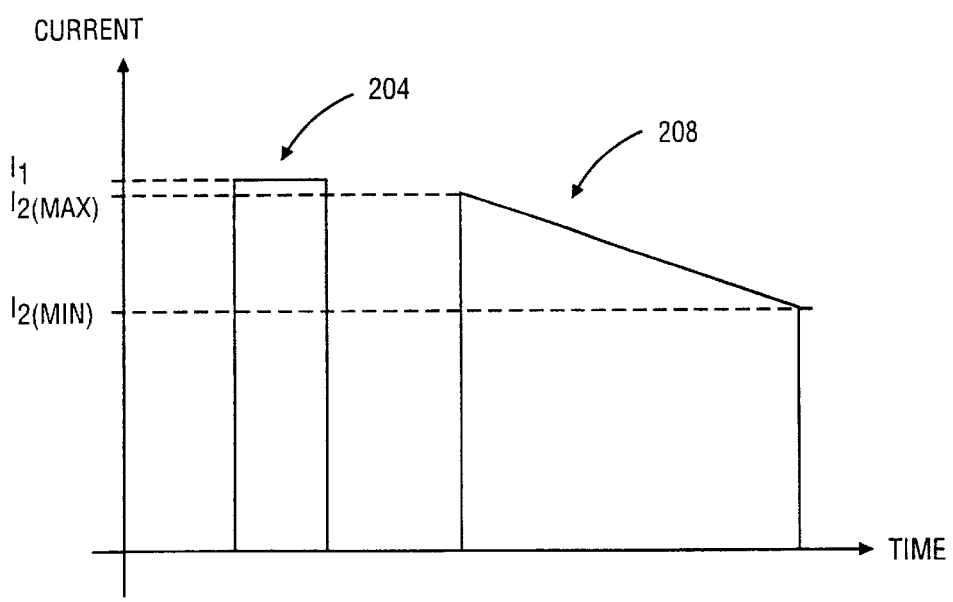
FIG. 2 illustrates a sequence of phase-change memory programming pulses including a set sweep, according to an embodiment of the invention.

FIG. 2 illustrates a sequence of phase-change memory programming pulses, according to an embodiment of the invention. A first pulse 204 is applied to a constituent cell of a phase-change memory. This pulse may be of any conventional type. A typical shape is rectangular as shown, with a constant, current magnitude. Rectangular pulses are relatively easy to generate, using only a single switching transistor (not shown). The first pulse 204 may, as mentioned above in the background, be a reset or amorphizing pulse having a magnitude $I_{reset}$ that is sufficiently high such that the phase-change material in the cell reaches $T_m$, the amorphizing temperature of the material. Alternatively, the current magnitude may be different so long as the first pulse 204 leaves the cell in a predefined state. The pulse width of the first pulse 204 is also selected to be long enough to achieve the predefined state.

Application of the first pulse 204 is followed by a second pulse 208 which is generally triangular in shape, as shown. The second pulse 208 has a leading portion that peaks at the magnitude or maximum, $I_{2(max)}$, and a trailing portion that decays to a minimum value $I_{2(min)}$. The leading portion may have a much greater slope than the trailing portion. The shape of the second pulse 208 can be selected, in view of fabrication process and material variations across the phase-change materials and the circuitry in the constituent cells of the memory device, such that every cell of the memory device changes from the first state to a second, different state if the second pulse 208 were applied to each of them. The first and second states may be the reset and set states mentioned above in the background. The shaping of the second pulse 208 involves setting a number of parameters that include the maximum and minimum values, and the decay rate/pulse width, in view of the structure and type of phase-change material used, as well as t he operating thermal environment of the memory device.

Figure 3:
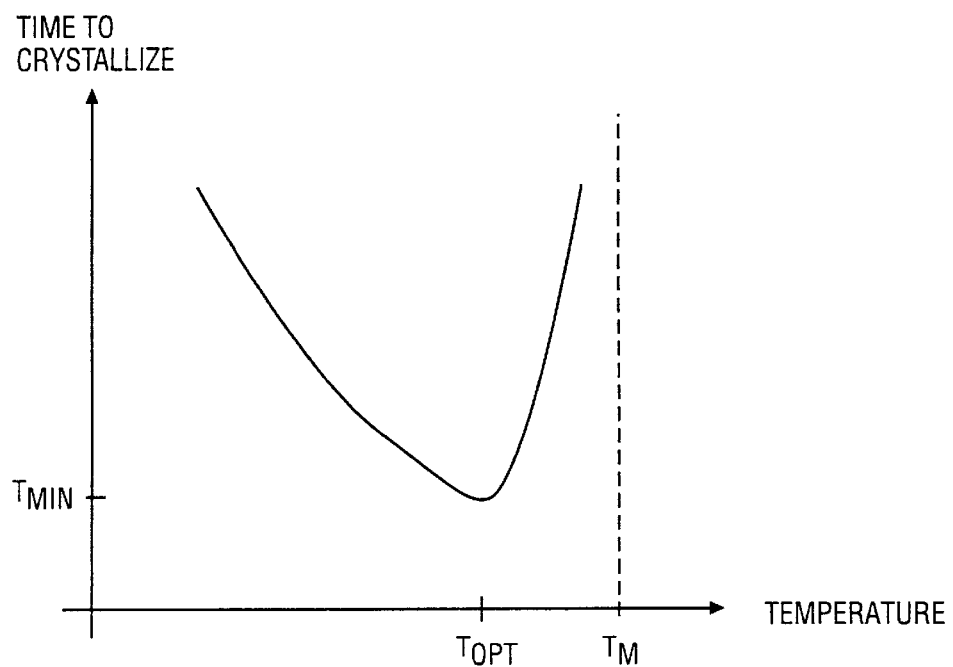
FIG. 3 illustrates a plot of crystallization time in a phase-change material memory cell as a function of t he temperature of the phase-change material.

The levels of $I_{2(max)}$ and $I_{2(min)}$ may assume a wide range of values. For instance, $I_{2(max)}$ may be substantially greater than $I_{reset}$, or it may be substantially smaller so long as the pulse width is long enough to insure that the phase-change materials in the cells to which the pulse is to be applied crystallize. Crystallization is a function of both the temperature and the amount of time the material spends at that temperature. This may be explained by FIG. 3 which illustrates an exemplary plot of crystallization time (in a phase-change material memory cell) as a function of the temperature of the phase-change material. The plot shows that at temperatures below $T_{opt}$, the material needs a longer time interval to crystallize. Hence, at lower current magnitudes (which translates roughly to lower temperatures being generated in the phase-change material), longer pulse widths are needed to set the phase-change memory cell. Ideally, a set pulse should have a current magnitude that yields $T_{opt}$, for as many cells as possible in a memory device, so as to provide the shortest set programming interval, $T_{min}$, as well the lowest set state resistance for those cells.

The level of $I_{2(min)}$ may also vary over a wide range of values, including as low as zero. Ideally, an upper bound on $I_{2(min)}$ for a set pulse may be one which insures that the temperature of the phase-change material in all cells to which the pulse will be applied is below $T_m$ at the end of the pulse (when $I_{2(min)}$ has been reached).

Figure 4:
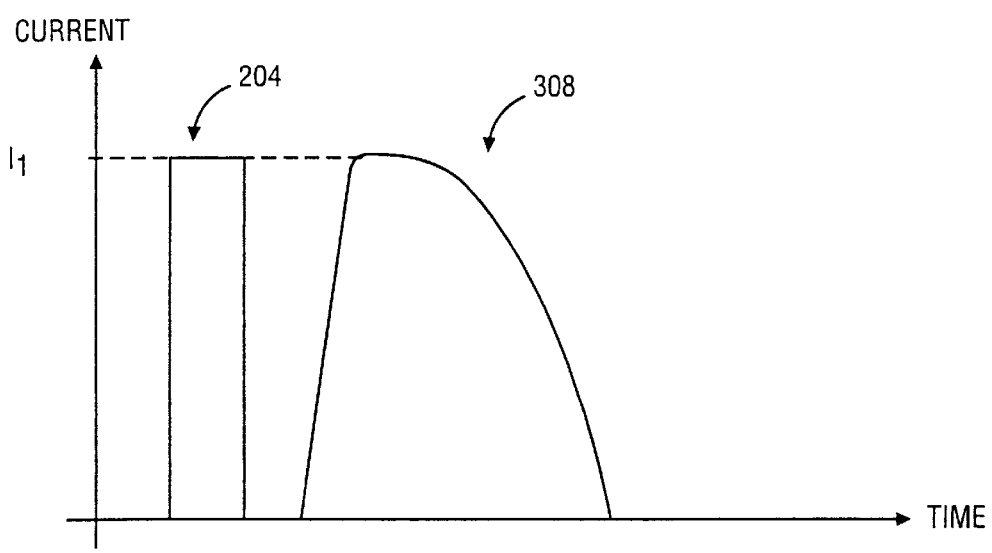
FIG. 4 depicts another sequence of phase-change memory programming pulses, including a set sweep.

FIG. 4 depicts another sequence of phase-change memory programming pulses. Note how the second pulse (set sweep) 308 in this example, although still referred to as generally triangular, has a relatively short intermediate portion between the leading and trailing portions, wherein the intermediate portion has essentially zero slope relative to the leading and trailing portions. Also, in contrast to the linear decay rate of FIG. 2, the trailing portion in FIG. 4 has a nonlinear slope. In general, the decay rate in the trailing portion may be of a wide range, including polynomial, logarithmic, and exponential, so long as the trailing portions cause all relevant cells in the device to sweep through a rapid crystallization temperature interval.

Figure 5:
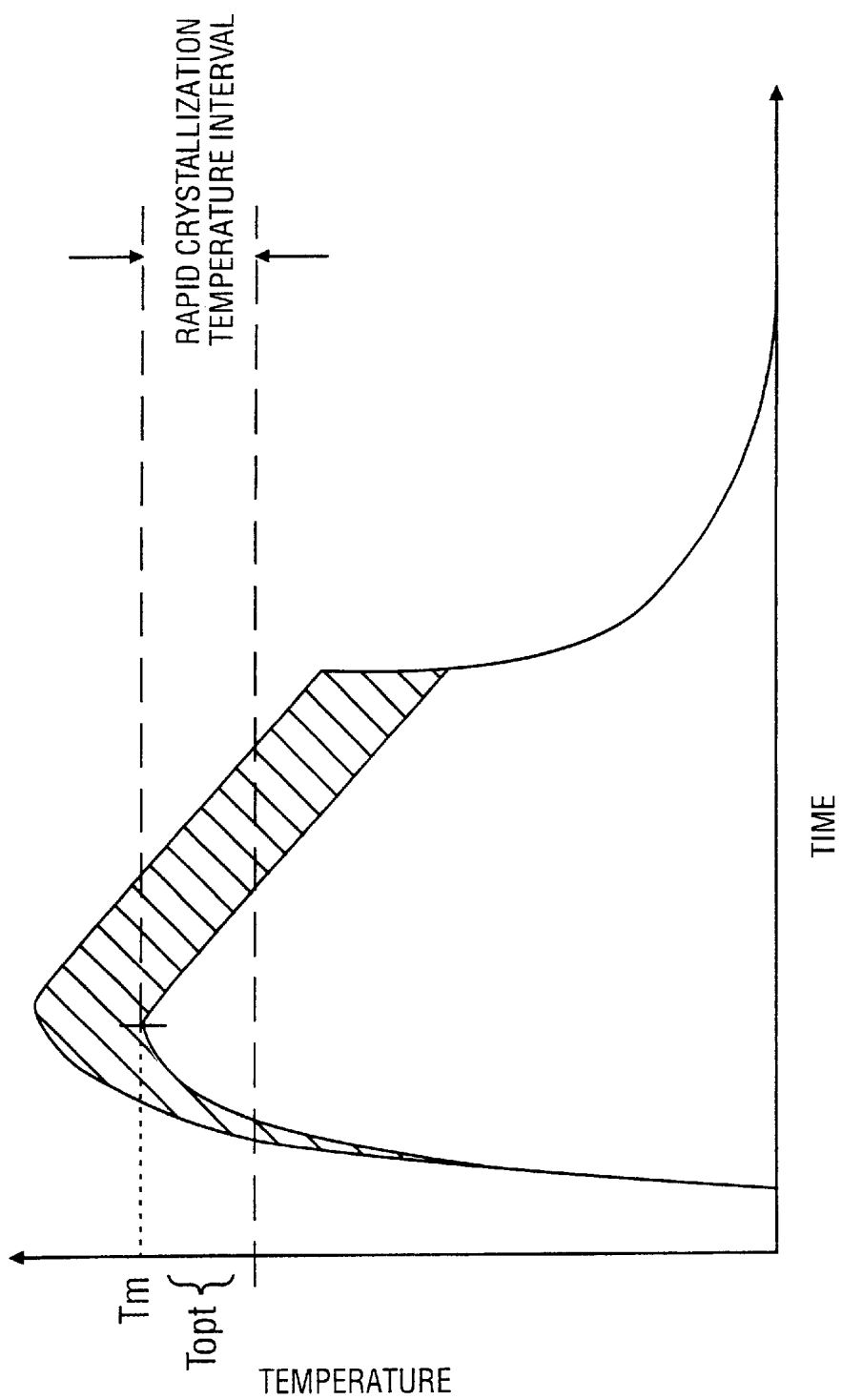
FIG. 5 shows the variation in the temperature of phase-change material in a memory cell versus time, while a set sweep according to an embodiment of the invention is being applied to the cell.
Figure 6:
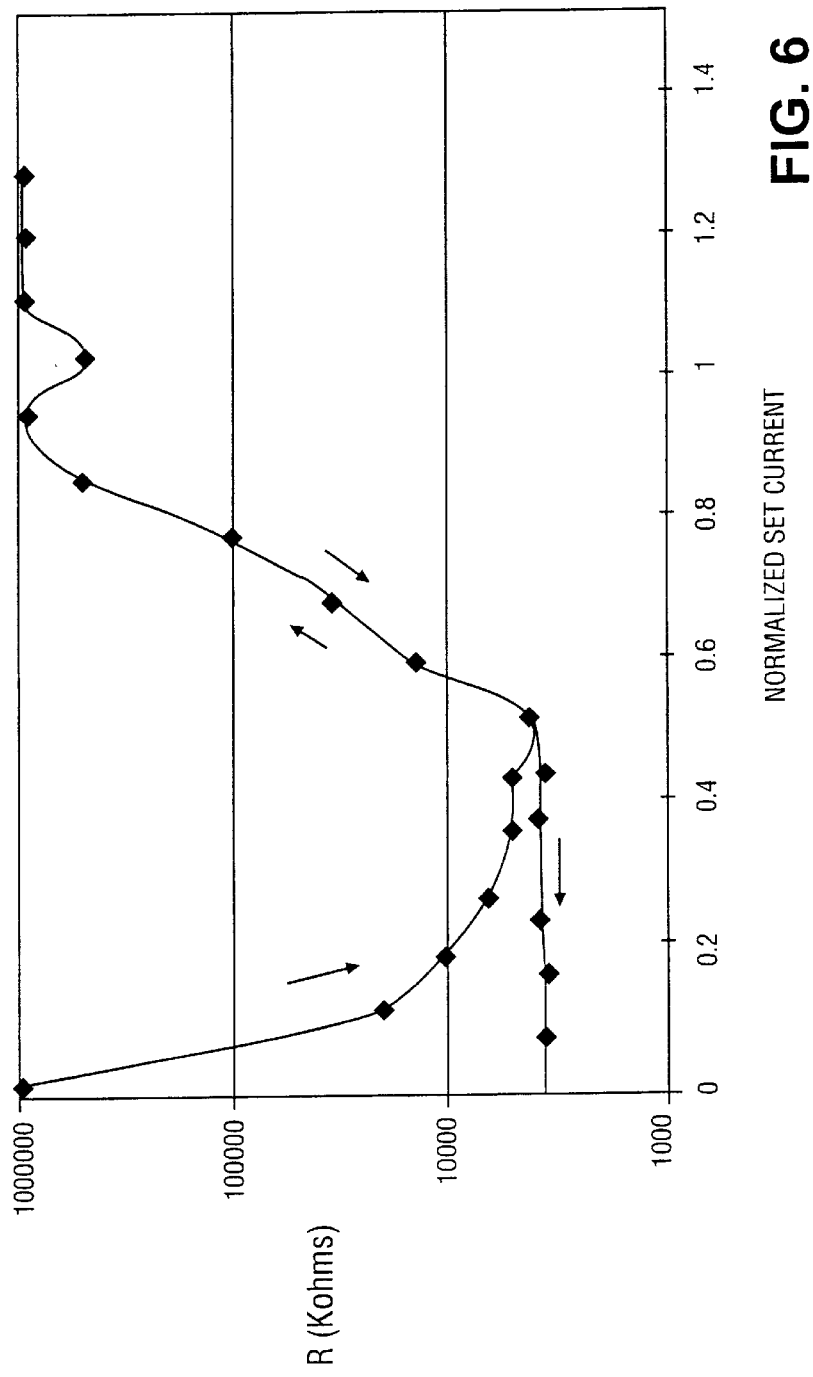
FIG. 6 illustrates a plot of memory cell resistance versus programming current level, for a particular phase-change memory device.

The effect of the triangular set pulse on cell temperatures in a phase-change memory are illustrated in the exemplary plot of FIG. 5. It can be seen that even with large variation in temperature (depicted by the shaded band) for a given magnitude and decay rate in the triangular set pulse, the entire memory device is swept through a rapid crystallization temperature interval, so that optimum, i.e. lowest, set resistance is obtained for all cells in the device. This is also illustrated in FIG. 6 which is a plot of memory cell resistance versus set current for a particular phase-change memory device. The resistance is plotted as the memory cell, beginning in the reset state, responds to the various levels of programming current. The sequence for applying the various levels of programming current is indicated by the arrows, starting from the left and then moving to the right and then coming back to the left. As can be seen, the lowest set resistance may be obtained at a value of set current just prior to its rapid rise towards the reset level. Advantageously, the triangular nature of the set pulse allows this lowest set resistance to be 'locked in' as the set sweep pulse sweeps back down from its peak value. Assuring the lowest set resistance for each cell in the memory device provides superior margin for memory read operations, higher manufacturing yields, as well as better product reliabilty.

Figure 7:
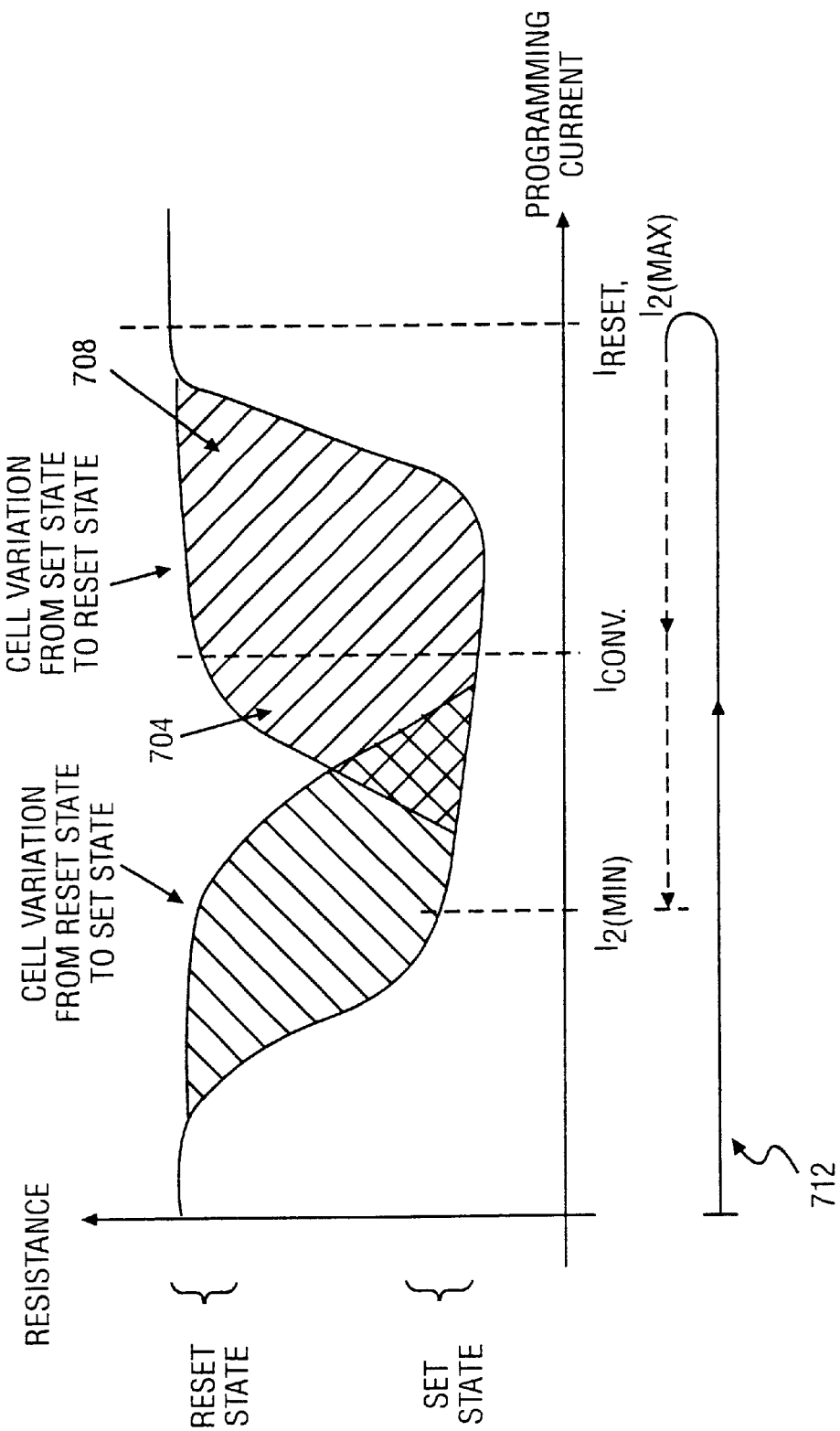
FIG. 7 depicts a plot of memory cell resistance versus programming current for a large population of memory cells, showing an example of a relatively wide variation in the population.

The advantages of the set sweep can also be appreciated by considering FIG. 7 which depicts a plot of memory cell resistance versus programming current for a large population of memory cells in a memory device. This device suffers from a relatively wide variation in the population of its constituent memory cells. To take all of the cells from the set state to the reset state, the application (to each cell) of the conventional rectangular pulse of magnitude $I_{reset}$ will work. However, the conventional programming technique of applying the same rectangular set pulse (with a constant magnitude) would be unable to return every cell in the device to the set state. That's because to do so the current magnitude needs to be at least as high as $I_{conv}$. But at that magnitude some of the cells, namely those falling within region 704, will stay at the reset state when the pulse has abruptly ended. In contrast, this does not occur with the set sweep if $I_{2(min)}$ is selected to be as shown, since all cells, including those in region 704 as well as those in region 708, will be swept through their crystallization temperature intervals (and therefore assured of returning to the set state) by the time the pulse has slowly decayed to $I_{2(min)}$. The set sweep is indicated by a loop 712 whose trailing portion is shown in dotted lines.

Figure 8:
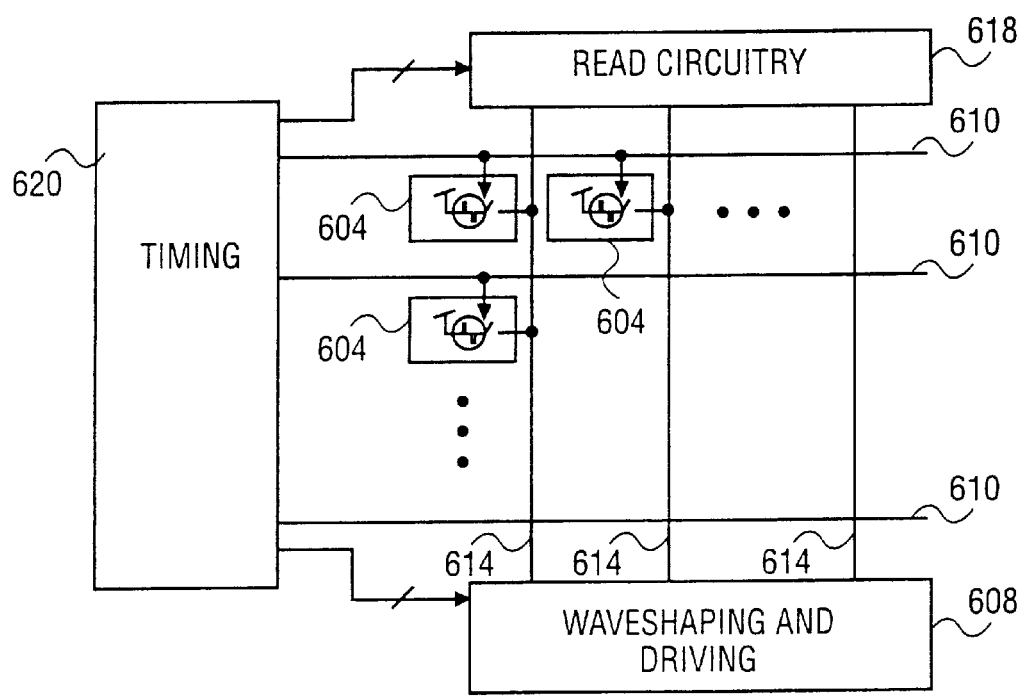
FIG. 8 illustrates a block diagram of a phase-change material memory device, including waveshaping and driving circuitry that are designed to provide the voltage and current levels needed to program the constituent cells of the device.

Turning now to FIG. 8, what is shown is a block diagram of a phase-change material memory device, including waveshaping and driving circuitry that are designed to provide the voltage and current levels needed to program the constituent cells of the device. The device features an array of memory cells 604 where each cell 604 can be accessed by a unique pair of vertical conductors 614 and horizontal conductors 610. In this embodiment, the horizontal conductors 610 allow a control signal from timing logic 620 to be provided to each cell 604 to close or open a solid state switch therein. This solid state switch is in series with a volume of the phase-change material whose other terminal is connected to a power supply or power return node. Current is thus sourced or sunk through the phase-change material when the switch is closed. This programming current is provided through the vertical conductors 614. The sourcing or sinking of the programming current is performed by either the read circuitry 618 or waveshaping and driving circuitry 608, depending upon whether a write or read operation is being performed. The read circuitry 618 may be entirely conventional.

The waveshaping and driving circuitry 608 will be designed so as to provide the voltage and current levels that are needed to program the cells 604 according to the first and second pulses described above, wherein the second pulse has a generally triangular shape. The waveshaping circuitry can be implemented using conventional analog waveshaping circuits such as integrator/ramp circuits, exponential and logarithmic circuits, as well as others. The shaped pulses-are then driven by conventional fanout circuitry so that each cell 604 that is connected to a vertical conductor 614 is assured of receiving the desired levels of current and voltage to achieve the set sweep.

The timing associated with the generation of the pulses may be determined by timing logic 620. Timing logic 620 provides digital control signals to the waveshaping and driving circuitry 608 and the read circuitry 618 so that the latter circuits either measure the resistance of the memory cell 604 (read operation) or provide the reset and set pulses at the correct timing and to the selected memory cell 604. Accesses to the cell 604 may be in random fashion where each cell can be accessed individually, or it may be orchestrated according to a row by row basis, depending upon the higher level requirements of the memory system.

The memory device depicted in FIG. 8 may be built using a wide range of different fabrication processes, including a slightly modified version of a conventional complimentary metal oxide semiconductor (CMOS) logic fabrication process. The array of cells 604 and the waveshaping and driving circuitry 608 may be formed in the same integrated circuit (IC) die if doing so can take advantage of the lower cost of system integration on a single chip.

Figure 9:
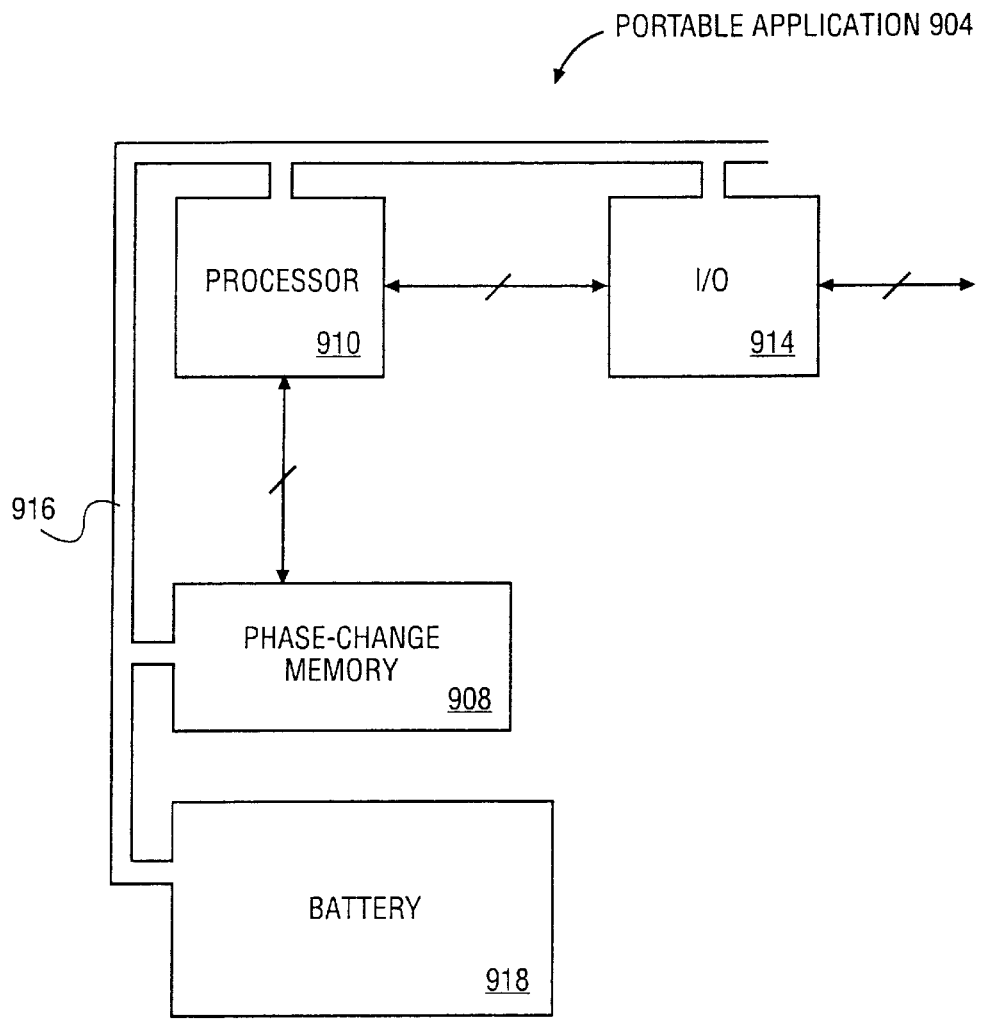
FIG. 9 depicts a block diagram of an embodiment of a portable application of a phase-change memory that incorporates the programming process.

FIG. 9 illustrates a block diagram of a portable application 904 of the phase-change memory programming process described above. A phase-change memory 908 is operated according to an embodiment of the programming process described above. The phase-change memory 908 may include one or more integrated circuit dies where each die has a memory array that is programmed according to the various embodiments of the programming techniques described above in FIGS. 1–8. These IC dies may be separate, stand alone memory devices that are arranged in modules such as conventional dynamic random access memory (DRAM) modules, or they may be integrated with other on-chip functionalities. In the latter embodiments, the phase-change memory 908 may be part of an I/O processor or a microcontroller.

The application 904 may be for instance a portable notebook computer, a digital still and/or video camera, a personal digital assistant, or a mobile (cellular) hand-held telephone unit. In all of these applications, an electronic system includes a processor 910 that uses the phase-change memory 908 as program memory to store code and data for its execution. Alternatively, the phase-change memory 908 may be used as a mass storage device for nonvolatile storage of code and data. The portable application 904 communicates with other devices, such as a personal computer or a network of computers via an I/O interface 914. This I/O interface 914 may provide access to a computer peripheral bus, a high speed digital communication transmission line, or an antenna for unguided transmissions. Communications between the processor and the phase-change memory 908 and between the processor and the I/O interface 914 may be accomplished using conventional computer bus architectures.

The above-described components of the portable application 904 are powered by a battery 918 via a power supply bus 916. Since the application 904 is normally battery powered, its functional components including the phase-change memory 908 should be designed to provide the desired performance at low power consumption levels. In addition, due to the restricted size of portable applications, the various components shown in FIG. 9 including the phase-change memory 908 should provide a relatively high density of functionality. Of course, there are other non-portable applications for the phase-change memory 908 that are not shown. These include, for instance, large network servers or other computing devices which may benefit from a non-volatile memory device such as the phase-change memory.

As an example, the phase-change material may be Ge2Sb2Te5. An exemplary pulse may have a peak current magnitude of Ireset, where Ireset is sufficiently high to allow the cells of the array to be programmed into the reset state. The exemplary pulse may also have a falling edge that decreases from Ireset to zero current in about 200 nsec. These specifics, however, are merely exemplary and the programming technique may work with a wide range of different phase-change materials and pulse shapes having relatively slow falling edges.

To summarize, various embodiment of a phase-change material memory programming technique, referred to as a set sweep, have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the phase-change material may be a chalcogenide alloy or other suitable structural phase-change material that acts as a programmable resistor. The specification and drawings are, accordingly, to be regarded in an illustrative rather than a restrictive sense.

What is claimed is:

1. A method for programming a memory device, comprising:
    applying a first pulse to a constituent cell of the memory device, the cell having a structural phase-change material to store the cell's data, to leave the material in a first state; and then
    applying a second pulse to the cell to change the material from the first state to a second, different state, the second pulse having a generally triangular shape.

2. The method of claim 1 wherein the second pulse has a leading portion followed by a trailing portion, the leading portion having a steeper slope than the trailing portion.

3. The method of claim 2 wherein the second pulse further includes an intermediate portion between the leading portion and the trailing portion and wherein the intermediate portion has essentially zero slope relative to the leading and trailing portions.

4. The method of claim 1 wherein the first pulse is shaped so as to leave the material in a high resistance state and the second pulse is shaped so as to leave the material in a low resistance state.

5. The method of claim 4 wherein a magnitude and a decay rate of the second pulse are such that every constituent cell of the memory device changes from the first state to the second state, if the first and second pulses were applied to it, despite fabrication process and material variations in the device.

6. The method of claim 5 wherein the magnitude is high enough to cause the phase-change material in at least some of the constituent cells of the device to reach an amorphizing temperature, if the second pulse were applied to those cells.

7. The method of claim 6 wherein the decay rate is slow enough to cause those constituent cells hat have reached the amorphizing temperature to cool down at a sufficiently slow pace so that the phase-change material in those cells changes from the first state to the second state.

8. A memory device comprising:
   an array having a plurality of constituent cells, each cell having a structural phase-change material to store the cell's data; and
   waveshaping and driving circuitry coupled to provide the voltage and current levels needed to program the plurality of constituent cells, the circuitry to generate a first pulse to be applied to one of the plurality of constituent cells of the memory device to leave the material of said constituent cell in a first state, and then a second pulse to be applied to said constituent cell to change its material from the first state to a second, different state, wherein the second pulse is to have a generally triangular shape.

9. The memory device of claim 8 wherein the waveshaping and driving circuitry is to shape the second pulse as having a leading portion followed by a trailing portion, the leading portion having a steeper slope than the trailing portion.

10. The memory device of claim 8 wherein the material can change from a high resistance state to a low resistance state in response, the circuitry to shape the first pulse so that when applied leaves the material in said constituent cell in the high resistance state, and to shape the second pulse so that when applied leaves the material in said constituent cell in the low resistance state.

11. The memory device of claim 10 wherein the circuitry is to shape the second pulse as having a magnitude and a decay rate such that every constituent cell of the memory device changes from the first state to the second state, if the first and second pulses were applied to it, despite fabrication process and material variations in the device.

12. The memory device of claim 11 wherein the circuitry is to shape the second pulse with the magnitude high enough to cause the phase-change material in at least some of the constituent cells of the device to reach an amorphizing temperature, if the second pulse were applied to those cells.

13. The memory device of claim 12 wherein the circuitry is to shape the second pulse with the decay rate low enough to cause those constituent cells that have reached the amorphizing temperature to cool down at a sufficiently slow pace so that the phase-change material in those cells changes from the first state to the second state.

14. The memory device of claim 8 wherein the array and the waveshaping and driving circuitry are formed in the same integrated circuit (IC) die.

15. A method for programming a memory device, comprising:
   applying a first pulse to a constituent cell of the memory device, the cell having a structural phase-change material to store the cell's data, to leave the material in a first state; and then
   applying a second pulse to the cell to change the material from the first state to a second, different state, the second pulse having an active interval in which a signal level of the second pulse is continuously varying with time, and wherein the cell changes from the first state to the second state during said active interval.

16. The method of claim 15 wherein the signal level is continuously decreasing with time during the active interval.

17. The method of claim 15 wherein the first pulse is shaped so as to leave the material in a high resistance state and the second pulse is shaped so as to leave the material in a low resistance state.

18. The method of claim 17 wherein a magnitude and a decay rate of the second pulse are such that every constituent cell of the memory device changes from the first state to the second state, if the first and second pulses were applied to it, despite fabrication process and material variations in the device.

19. A memory device comprising:
   an array having a plurality of constituent cells, each cell having a structural phase-change material to store the cell's data; and
   waveshaping and driving circuitry coupled to provide the voltage and current levels needed to program the plurality of constituent cells, the circuitry to generate a first pulse to be applied to one of the plurality of constituent cells of the memory device to leave the material of said constituent cell in a first state, and then a second pulse to be applied to said constituent cell to change its material from the first state to a second, different state, the second pulse having an active interval in which a signal level of the second pulse is continuously varying with time, and wherein said constituent cell is to change from the first state to the second state during said active interval.

20. The memory device of claim 19 wherein the circuitry is to shape the second pulse so that its signal level is continuously decreasing with time during the active interval.

21. The memory device of claim 19 wherein the first pulse is shaped so as to leave the material in a high resistance state and the second pulse is shaped so as to leave the material in a low resistance state.

22. The memory device of claim 21 wherein a magnitude and a decay rate of the second pulse are such that every constituent cell of the memory device changes from the first state to the second state, if the first and second pulses were applied to it, despite fabrication process and material variations in the device.

* * * * *

UNITED STATES PATENT AND TRADEMARK OFFICE
CERTIFICATE OF CORRECTION

PATENT NO. : 6,687,153 B2　　　　　　　　　　　　　　　　　　　　　Page 1 of 1
DATED : February 3, 2004
INVENTOR(S) : Tyler A. Lowrey It is certified that error appears in the above-identified patent and that said Letters Patent is hereby corrected as shown below:

Column 7,
Line 21, "hat" should be -- that --.

Signed and Sealed this

Twentieth Day of April, 2004

JON W. DUDAS
*Acting Director of the United States Patent and Trademark Office*